United States Patent
Thome et al.

(10) Patent No.: US 7,916,481 B2
(45) Date of Patent: Mar. 29, 2011

(54) ELECTRONIC BOARD AND COLD PLATE FOR SAID BOARD

(75) Inventors: Caryl Thome, Saint Egreve (FR); Stéphane Robert, Meylan (FR)

(73) Assignee: Sames Technologies, Meylan (FR)

( * ) Notice: Subject to any disclaimer, the term of this patent is extended or adjusted under 35 U.S.C. 154(b) by 0 days.

(21) Appl. No.: 12/522,449

(22) PCT Filed: Jan. 7, 2008

(86) PCT No.: PCT/FR2008/000017
§ 371 (c)(1),
(2), (4) Date: Oct. 13, 2009

(87) PCT Pub. No.: WO2008/099085
PCT Pub. Date: Aug. 21, 2008

(65) Prior Publication Data
US 2010/0033932 A1  Feb. 11, 2010

(30) Foreign Application Priority Data
Jan. 8, 2007  (FR) ..................... 07 00077

(51) Int. Cl.
*H05K 7/20* (2006.01)
(52) U.S. Cl. ... 361/699; 361/689; 361/707; 165/104.33; 174/15.1; 257/714

(58) Field of Classification Search .................. None
See application file for complete search history.

(56) References Cited

U.S. PATENT DOCUMENTS

| | | | | |
|---|---|---|---|---|
| 5,316,075 A | * | 5/1994 | Quon et al. | 165/80.4 |
| 6,105,373 A | * | 8/2000 | Watanabe et al. | 62/3.7 |
| 6,684,942 B2 | * | 2/2004 | Song et al. | 165/122 |
| 7,104,078 B2 | * | 9/2006 | Tilton | 62/121 |
| 7,464,747 B2 | * | 12/2008 | Nakahama et al. | 165/80.2 |
| 7,522,417 B2 | * | 4/2009 | Pautsch et al. | 361/699 |
| 7,787,248 B2 | * | 8/2010 | Campbell et al. | 361/700 |
| 2005/0143000 A1 | | 6/2005 | Eisele et al. | |
| 2007/0133173 A1 | * | 6/2007 | Hsiung et al. | 361/699 |

FOREIGN PATENT DOCUMENTS

| | | |
|---|---|---|
| EP | 0844812 A | 5/1998 |
| FR | 2715773 A | 8/1995 |
| FR | 2847762 A | 5/2004 |
| WO | 9508844 A | 3/1995 |

* cited by examiner

*Primary Examiner* — Boris L Chervinsky
(74) *Attorney, Agent, or Firm* — Browdy and Neimark, PLLC

(57) ABSTRACT

The invention relates to an electronic board that comprises: a planar projection plate (42) provided between an intake opening (70) and a discharge opening (72); and a plurality of rectilinear nozzles (86-90) extending through said plate along a projection direction, the projection direction of each nozzle defining an angle relative to a direction perpendicular to a sole (78) of the electronic component (6) to be cooled, the angle α being comprised in a range of −30 and +30°.

7 Claims, 4 Drawing Sheets

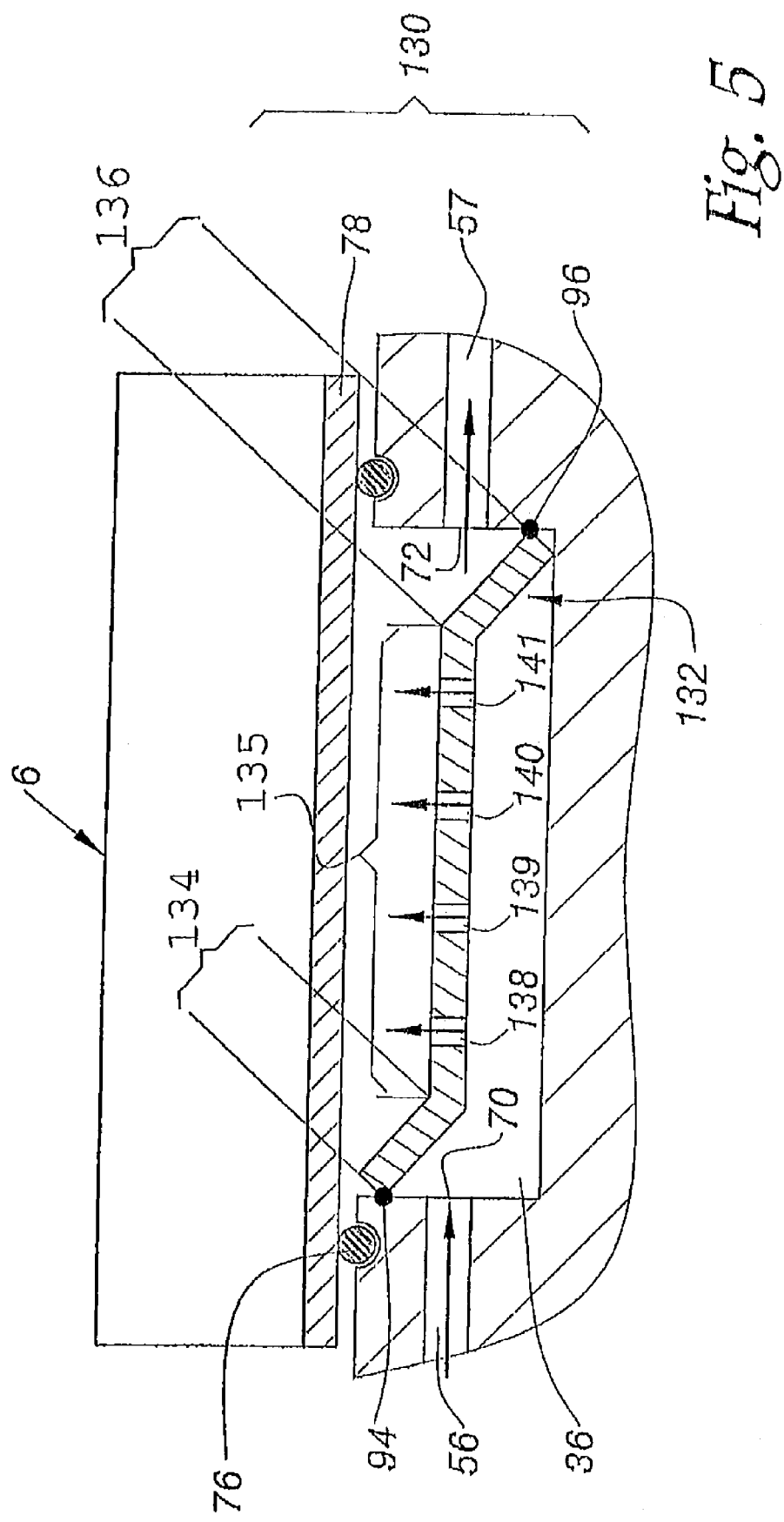

ELECTRONIC BOARD AND COLD PLATE FOR SAID BOARD

The present invention relates to an electronic circuit card and to a cold plate for cooling the card.

Electronic circuit cards exist that include:
- at least one electronic power component fitted with a soleplate suitable for being put directly into contact with a cooling fluid;
- a cold plate having the soleplate of the electronic power component fastened thereon in a manner that is leaktight relative to the cooling fluid, the cold plate including:
  - at least one recess including an opening that opens out under the soleplate of the electronic power component;
  - an admission orifice for admitting cooling fluid into the inside of the recess; and
  - a discharge orifice for discharging cooling fluid from the recess.

For such electronic circuit cards, plastics inserts are inserted in the recesses. Each insert has a plurality of channels in fluid flow connection on one side with the admission orifice and opening out at the other side perpendicularly to the soleplate of the electronic power component. In operation, each of these channels produces a jet of cooling fluid that is perpendicular to the soleplate of the electronic power component in order to optimize heat exchange.

The fabrication, and in particular the machining, of such inserts is complicated.

The invention seeks to remedy that drawback by proposing an electronic circuit card that is cooled as described above but that is simpler to fabricate.

The invention thus provides an electronic circuit card in which the cold plate comprises:
- a spray plate interposed between the admission orifice and the discharge orifice; and
- a plurality of rectilinear nozzles passing right through said plate in a spray direction, the length of the nozzle along the spray direction being longer than or equal to the greatest width of the nozzle perpendicular to said direction so as to form a jet of cooling fluid along the spray direction, the spray direction of each nozzle being at an angle $\alpha$ relative to a direction perpendicular to the soleplate, the angle $\alpha$ lying in the range $-30°$ to $+30°$.

The above electronic circuit card is simpler to make since it is simpler to make a plate having through nozzles than it is to make an insert having channels that open out directly into the admission orifice.

The invention also provides a cold plate suitable for being implemented in the above electronic circuit card.

Embodiments of said cold plate may include one or more of the following characteristics:
- each nozzle is formed by a hole passing through the spray plate;
- the spray direction of each nozzle is perpendicular to a front or rear face of the spray plate, the front face of the spray plate being the face facing towards the soleplate and the rear face being the face opposite from the front face, and the spray plate is inclined at an angle $\beta$ relative to the plane of the soleplate of the electronic power component, the angle $\beta$ lying in the range $-30°$ to $+30°$;
- the cold plate includes ducts suitable for enabling the cooling fluid to flow through the admission and discharge orifices, said ducts all being disposed in a common plane parallel to the plane defined by the soleplate;
- the cold plate includes:
  - first and second recesses, the first and second recesses each having an opening opening out under the soleplate of a common first electronic power component;
  - at least one third recess having an opening opening out under the soleplate of a second electronic power component; and
  - the discharge orifice of the first recess being in fluid flow connection with the admission orifice of the second recess, passing via the admission and discharge orifices of the third recess; and
- the cold plate includes at least ten nozzles arranged relative to one another so as to produce jets of cooling fluid having impact points that are uniformly distributed over the soleplate, i.e. the distances between two adjacent impact points are all equal to one another within ±15%.

These embodiments of the cold plate also present the following advantages:
- making nozzles in the form of holes in the plate simplifies making the plate;
- placing the nozzles perpendicularly to the front or rear face of the plate further simplifies making and fabricating the plate;
- the fact of having the sum of the cross-sectional areas of the nozzles equal to the cross-sectional areas of the admission and discharge orifices facilitates the flow of the cooling fluid within the cold plate;
- the fact of placing ducts suitable for causing the cooling fluid to flow inside the cold plate in a common plane enables the thickness of the cold plate to be limited, and also makes it possible to cool the cold plate throughout its bulk, thereby removing heat from other components implanted on the card that are not in direct contact with the cooling fluid;
- using first and second recesses having openings that open out under the soleplate of a common electronic power component and connecting these two recesses together via a third recess used for cooling a second electronic power component enables the cooling differences between the first and second electronic power components to be reduced compared with circumstances in which the first and second electronic power components are each cooled by a single recess; and
- using more than ten nozzles serves to increase the effectiveness of the cooling.

The invention can be better understood on reading the following description given purely by way of non-limiting example and made with reference to the drawings, in which:

FIGS. 4 and 5 are diagrammatic views respectively of a second and a third embodiment of a spray plate usable in the FIG. 2 cold plate.

In these figures, the same references are used to designate the same elements.

In the description below, characteristics and functions that are well known to the person skilled in the art are not described in detail.

Figure 1:
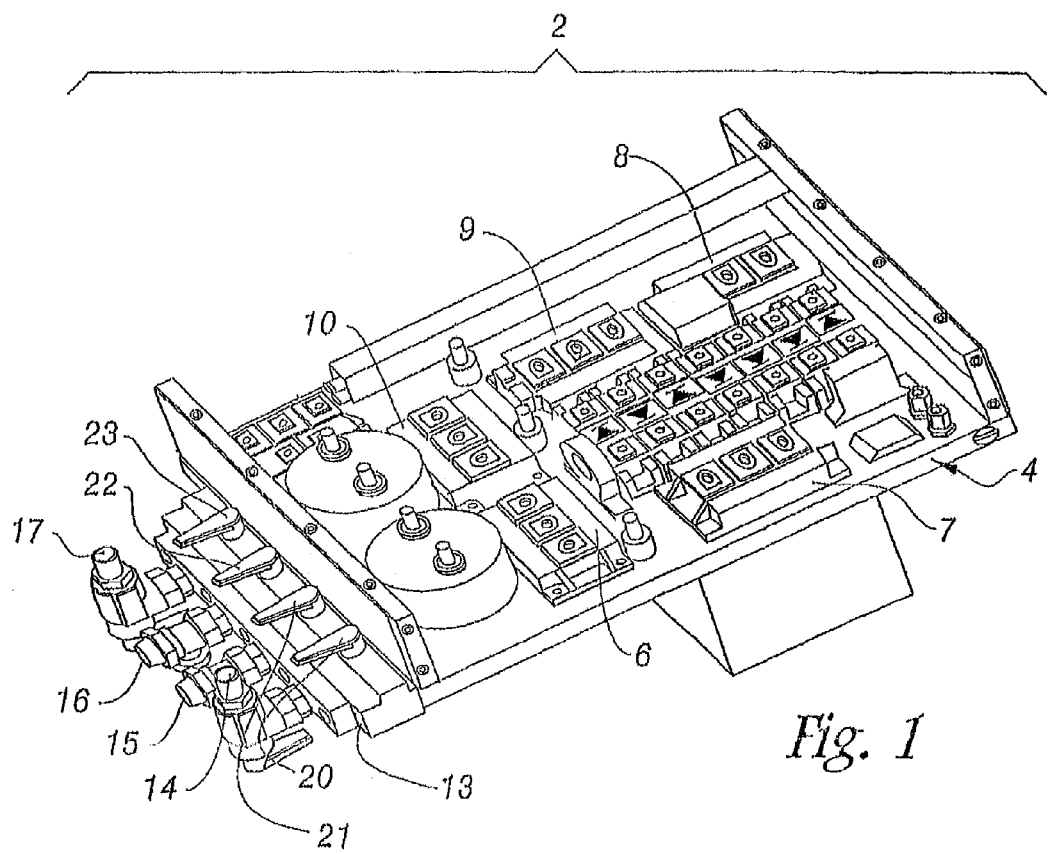
FIG. 1 is a diagrammatic perspective view of an electronic circuit card.

FIG. 1 shows an electronic circuit card 2 fitted with a plurality of electronic power components mounted on a cold plate 4.

The term "electronic power component" is used herein to designate components liable to convey alternating or direct currents at several tens of amps without any damage. Typically they are switches suitable for switching such currents.

The card 2 shown has five power switches 6 to 10. These power switches are implemented using insulated gate bipolar transistors (IGBTs). The other electronic components shown in FIG. 1 are not necessary for understanding the operation of the cold plate and they are therefore not described in detail herein.

On one side edge, the cold plate 4 presents a connection plane 13 suitable for releasably receiving four couplings 14 to 17 enabling the cold plate 4 to be connected for fluid flow with one or more sources of cooling fluid. More precisely, the couplings 14 and 17 are upstream couplings via which the cooling fluid penetrates into the cold plate 4. Conversely, the couplings 15 and 16 are downstream couplings via which the cooling fluid leaves the cold plate 4. Each of the couplings 14 to 17 is fitted with an isolating valve suitable for preventing the cooling fluid from flowing, in particular when the couplings 14 to 17 are separated from the connection plane 13.

The plate 4 is also fitted with four valves 20 to 23 each serving to interrupt the incoming or outgoing flow of fluid via the couplings 14 to 17, respectively.

The cold plate is for cooling the various electronic components mounted thereon, and in particular the electronic power components such as the switches 6 to 10.

Figure 2:
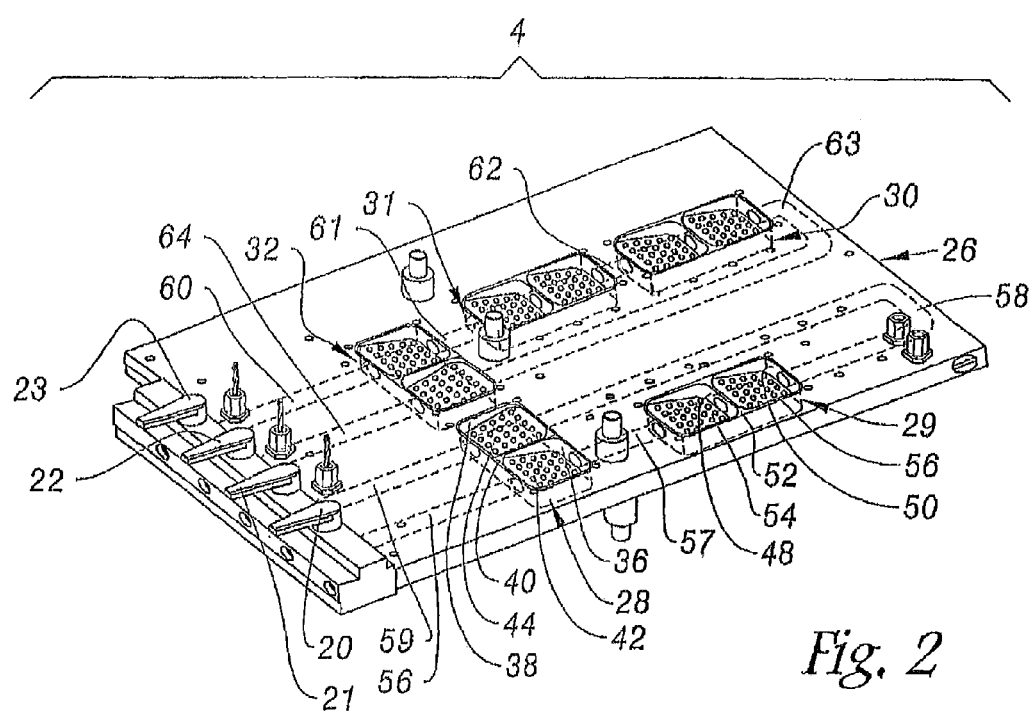
FIG. 2 is a diagrammatic perspective view of a cold plate used in the FIG. 1 card.

FIG. 2 shows the cold plate 4 in greater detail. The cold plate 4 is constituted by a plate 26 made of a material that is a good conductor of heat. Herein, a material is said to be a "good" conductor of heat when the material presents thermal conductivity greater than 50 watts per meter kelvin (W/mK). For example, the plate 26 is made of EN AW6082 aluminum.

The cold plate 4 also has five basins 28 to 32 hollowed out in the thickness of the plate 26. Each of these basins 28 to 32 is open solely into the top face of the plate 26 directly under a respective one of the switches 6 to 10. More precisely, the periphery of the opening to each basin is situated entirely beneath the corresponding switch (IGBT) when mounted on the cold plate 4.

In this example, the basins 28 and 32 are of identical structure and these basins differ solely in their positions in the plate 26. Similarly, the basins 29, 30, and 31 have exactly the same structure and they differ solely by their positions in the plate 26. Thus, only the structures of the basins 28 and 29 are described in greater detail herein.

The basin 28 is formed by two recesses 36 and 38 placed beside each other and separated from each other by a leaktight wall 40. The wall 40 is designed to prevent the cooling fluid present in one of the recesses being able to pass directly into the other recess. The recesses 36 and 38 are identical, each being in the form of a rectangular parallelepiped.

Within each of the recesses 36 and 38 there are mounted respective oblique sloping spray plates, given references 42 and 44.

The structure of the recess 36 is described below with reference to FIG. 3.

The basin 29 likewise has two recesses 48 and 50 separated from each other by a wall 52. Nevertheless, unlike the wall 40, the wall 52 is provided with one or more holes enabling the recess 48 to be put into fluid flow connection with the recess 50.

Each of the recesses 48 and 50 contains a sloping spray plate given respective references 54 and 56. The structures of the recesses and of the sloping plates in the basin 29 are similar to those in the basin 28 and are therefore not described in greater detail herein.

The cold plate has a first circuit for cooling the switches 6 and 7, the first circuit comprising:

a duct 56 putting the coupling 14 into fluid connection with the recess 36;

a duct 57 putting the recess 36 into fluid connection with the recess 48;

a duct 58 putting the recess 50 into fluid connection with the recess 38; and a duct 59 putting the recess 38 into fluid connection with the coupling 15.

The cold plate 4 also has a second cooling fluid flow circuit under the switches 8, 9, and 10, this circuit comprising:

a duct 60 putting the coupling 17 into fluid connection with the left recess of the basin 32;

a duct 61 putting said left recess into fluid connection with the first recess of the basin 31;

a duct 62 putting this second recess of the basin 31 into fluid connection with the first recess of the basin 30;

a duct 63 putting the second recess of the basin 30 into fluid connection with the right recess of the basin 32; and a duct 64 putting the right recess of the basin 32 into fluid connection with the coupling 16.

All of these ducts 56 to 64 are disposed in a common plane parallel to the top face of the plate 26.

Figure 3:
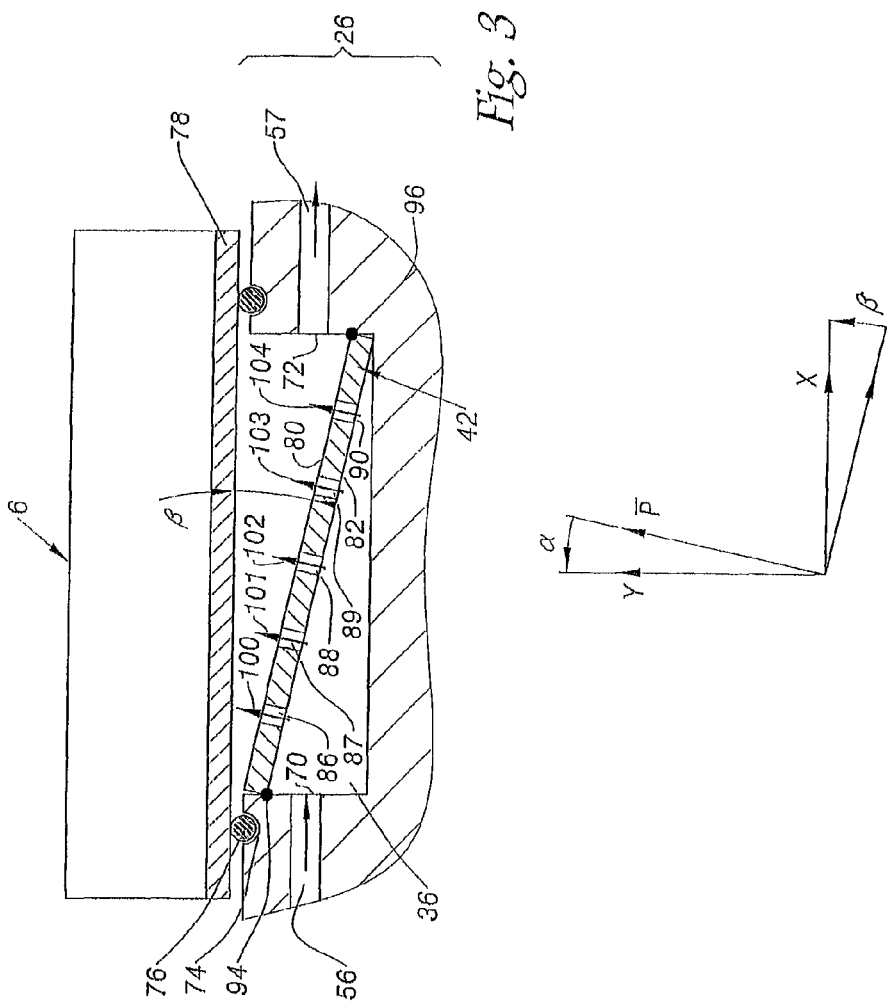
FIG. 3 is a fragmentary section view of a first embodiment of a spray plate usable in the FIG. 2 cold plate.

FIG. 3 shows the recess 36 and the plate 42 in greater detail.

The duct 56 opens out into the recess 36 via a cooling fluid admission orifice 70. After passing through the recess 36, the cooling fluid escapes from the recess 36 via a discharge orifice 72. The orifice 72 is formed by the duct 57 that opens out into the recess 36. Here the orifices 70 and 72 lie on the same axis.

As shown in FIG. 3, the opening of the basin 29 that opens out into the top face of the plate 26 is surrounded by a groove 74. The groove 74 receives a gasket 76. The gasket 76 provides sealing between the soleplate 78 of the switch 6 and the top face of the plate 26. Typically, the soleplate 78 constitutes the bottom face of the switch 6 and it is made of a material that is a good conductor of heat, such as copper.

Since the soleplate 78 completely covers the opening of the basin 28 that opens out into the top face of the plate 26, this opening is closed hermetically by the soleplate 78 so that the cooling fluid cannot escape through this opening. It should also be observed that in this configuration, the soleplate 78 is put directly into contact with the cooling fluid present in the recess 36.

FIG. 3 shows two orthogonal directions X and Y. The direction Y is perpendicular to the plane of the soleplate 78. The direction X is parallel to the plane of the soleplate 78.

The spray plate 42 presents a front face 80 facing towards the soleplate 78 and a rear face 82 facing towards the orifice 70.

Here the plate 42 is pierced by holes, each hole thus forming a nozzle suitable for creating a jet of cooling fluid that strikes directly against the soleplate 78 in a spray direction that is substantially perpendicular to the soleplate 78. The fact that the jets are substantially perpendicular to the soleplate 78 increases the effectiveness of the cooling. The term "substantially" perpendicular to the soleplate 78 is used herein to mean that the jet is sprayed in a direction P forming an angle $\alpha$ lying in the range $-30°$ to $+30°$ relative to the direction Y. The spraying direction P is represented by a vector $\vec{P}$ in FIG. 3.

FIG. 3 shows only five holes 86 to 90. Each of these holes extends along the spraying direction P. In this embodiment, the spraying direction P is also perpendicular to the faces 80 and 82. The greatest transverse width of each of these holes is selected to be less than or equal to the length of the hole in the direction P.

Furthermore, the smallest width of each of these holes is selected to be greater than or equal to 0.5 millimeters.

In this embodiment, each hole has a constant circular cross-section. The diameters of the holes are also selected in this example so that the sum of the through areas of the holes is equal to the through area of the orifice 70.

The area of the orifice 72 is likewise equal to the area of the orifice 70.

The cross-section of the ducts 56 to 59 is constant.

The plate 42 is interposed between the orifice 70 and the orifice 72 in such a manner that more than 85% of the cooling fluid passing through the recess 36 also passes through the holes formed in the plate 42. For this purpose, the plate 42 bears directly against an upstream wall in the recess 36 along a line 94 situated above the orifice 70. On the opposite side, the plate 42 bears directly against a downstream wall of the recess 36 along a line 96 situated beneath the orifice 72. Here the plate 42 is removable. By way of example, it is merely placed in the recess 36 and held in position by the soleplate of plate 42 when the cooling fluid passes through the holes 86 to 90. For example, the soleplate forms an abutment for the plate 42 in such a manner that the spray direction of the cooling fluid is kept substantially perpendicular to the soleplate.

In FIG. 3, the lines 94 and 96 are perpendicular to the plane of the figure and they are therefore represented by dots.

The plate 22 is also in contact with the wall 40 and with the wall of the recess 36 that is opposite to the wall 40.

To ensure that the direction P is substantially perpendicular to the soleplate 78, the plane of the plate 42 forms an angle β relative to the plane of the soleplate 78 that lies in the range −30° to 0°. This angle β is measured relative to the direction X in FIG. 3.

By way of example, in this embodiment, the diameter of each hole is 3 mm and the thickness of the plate 42 is likewise 3 mm.

When the cold plate 4 is in operation, the cooling fluid penetrates into the recess 36 via the orifice 70. Thereafter it is sprayed in the form of jets 100 to 104 along the direction P. Each of these jets strikes directly against the soleplate 78. Thereafter, after striking the soleplate 78, the cooling fluid is discharged via the orifice 72.

The fluid discharged from the recess 36 is then conveyed by the duct 57 to the recess 48.

In the recess 48, the fluid is projected in the form of jets that are substantially perpendicular to the soleplate of the switch 7, in a manner that is similar to that described for the recess 36, prior to being discharged to the recess 50 via the hole(s) formed in the wall 52.

In the recess 50, the cooling fluid is sprayed in the form of jets substantially perpendicular to the soleplate of the switch 7, and is then discharged via the duct 58 to the recess 38.

In the recess 38, the cooling fluid is sprayed in the form of jets that are substantially perpendicular to the soleplate 78 and is then discharged via the duct 59 prior to returning to the source of cooling fluid. The source of cooling fluid typically comprises a pump suitable for causing the cooling fluid to flow along the ducts 56 to 59.

Given that the cold fluid enters via the coupling 14, the temperature difference between the cooling fluid present in the recess 36 and the soleplate 78 is greater than the temperature difference between the fluid present in the recess 48 and the soleplate of the switch 7. As the cooling fluid advances through the cooling circuit, it becomes heated. Consequently, the effectiveness of the cooling in the recess 36 is high, and conversely it is relatively lower in the recess 38. It is also possible to consider that the effectiveness of the cooling in the recesses 48 and 50 is relatively average. It can thus be understood that by connecting the recess 36 for fluid flow with the recess 38 via the recesses 48 and 50, the cooling of the switches 6 and 7 is made more uniform. The switch 6 is cooled effectively by the recess 36 and relatively less effectively by the recess 38, which amounts to effective mean cooling and thus to cooling that is quite close to that to which the switch 7 is subjected. The operation of the basins 30 to 32 can be deduced from the above-described operation of the basins 28 to 29.

Figure 4:
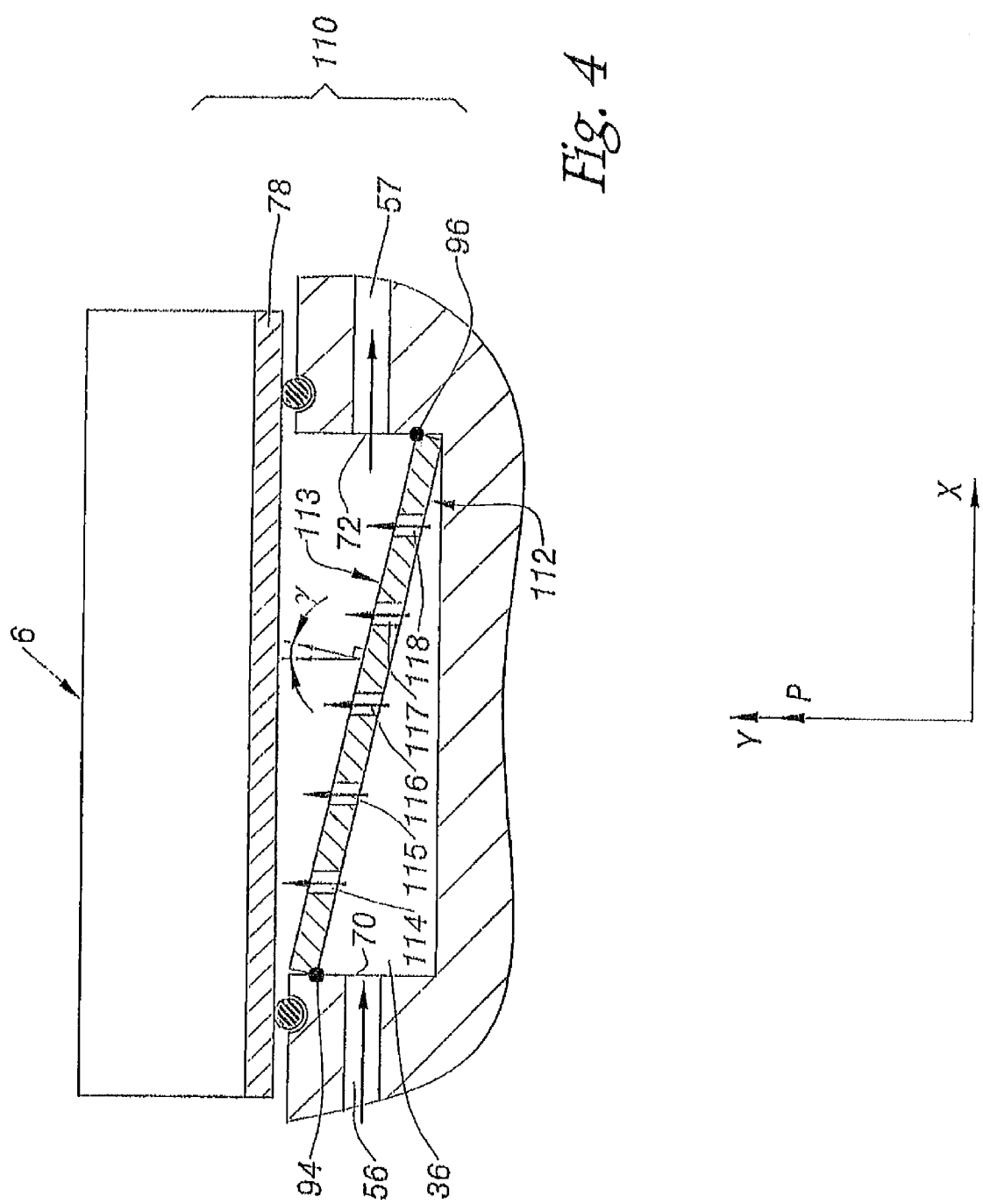

FIG. 4 shows another embodiment of a cold plate 110 identical to the cold plate 4 except that the plate 42 is replaced by a plate 112. The plate 112 is arranged inside the recess 36 in identical manner to that described with reference to the plate 42. The plate 112 differs from the plate 42 solely by the fact that the holes are made in a spray direction P that is not perpendicular to the front and rear faces of the plate 112. More precisely, in the embodiment of FIG. 4, five holes 114 to 118 are shown. These holes 114 to 118 extend along the spray direction P. In this embodiment, the spray direction P is at an angle γ relative to the direction perpendicular to the front face 113. Here the angle γ is taken to be equal to −β, such that the angle γ lies in the range −30° to 0°.

FIG. 5 shows another embodiment of a cold plate 120 identical to the cold plate 4 with the exception that the plate 42 is replaced by a plate 132. The plate 132 differs from the plate 42 mainly by the fact that it is not plane, but comprises three contiguous planes 134 to 136 that abut edge to edge.

The plane 134 is an inclined plane extending from the line 94 situated above the orifice 70 to a middle position situated at half-height between the soleplate 78 and the bottom of the recess 36.

The plane 135 is a plane parallel to the soleplate 78.

Finally, the plane 136 is another sloping plane extending from the substantially middle position to the line 96 of contact situated beneath the orifice 72.

Only the horizontal plane 135 is pierced by holes 138 to 141 forming nozzles suitable for creating jets of cooling fluid perpendicular to the soleplate 78.

Numerous other variants are possible. For example, the number of holes may in the plates may vary. As a minimum, there must be at least two holes, and preferably the number of holes is greater than twenty.

In a variant, there is only one recess beneath each electronic power component for cooling. This embodiment is particularly appropriate when the inlet and outlet cooling fluid couplings are situated on opposite edges of the plate 26. Conversely, in order to make the cooling of the various electronic power components even more uniform, more than two recesses may be provided beneath a single electronic power component.

Typically, the cooling fluid is water. Nevertheless, it could also be oil, a mixture of water and antifreeze, or any other cooling fluid.

In a variant, the orifice 70 is formed in the bottom of the recess and not in a side wall. In this embodiment, the angles β and γ lie in the range −30° to +30°.

The holes may be of square or of arbitrary cross-section. In particular, the cross-section of each hole may taper when advancing in the flow direction of the cooling fluid. Under such circumstances, and preferably, it is the sum of the smallest cross-sectional areas of the holes that is equal to the area of the cross-section of the orifice 70.

The cross-sectional area of the orifice 70 or of the orifice 72 is not necessarily equal to the sum of the cross-sectional areas of the holes or the nozzles. For example, the cross-sectional area of the orifice 70 or 72 may represent 20% to 200% of the sum of the cross-sectional areas of the holes.

A plurality of admission and/or discharge orifices for cooling fluid may be provided into a single recess.

In the embodiments described, the holes directly constitute spray nozzles without it being necessary to add any material whatsoever. In a variant, the nozzle-forming pipes are engaged in each of the holes formed in the plates. The ends of each of the pipes may possibly project from the front and rear faces of the plate.

The invention claimed is:

1. An electronic circuit card comprising:
   at least one electronic power component (6 to 10) fitted with a soleplate (78) suitable for being put directly into contact with a cooling fluid;
   a cold plate (4) having the soleplate (78) of the electronic power component fastened thereon in a manner that is leaktight relative to the cooling fluid, said cold plate comprising:
   at least one recess (36, 38, 48, 50) including an opening that opens out under the soleplate of the electronic power component (6 to 10);
   at least one admission orifice (70) for admitting cooling fluid into the inside of the recess; and
   at least one discharge orifice (72) for discharging cooling fluid from the recess;
   wherein said cold plate (4) further comprises:
   a spray plate (42; 112) interposed between the admission orifice (70) and the discharge orifice (72); and
   a plurality of rectilinear nozzles (86 to 90; 114 to 118) passing right through said plate in a spray direction, the length of the nozzle along the spray direction being longer than or equal to the greatest width of the nozzle perpendicular to said direction so as to form a jet (100 to 104) of cooling fluid along the spray direction, the spray direction of each nozzle being at an angle α relative to a direction perpendicular to the soleplate, the angle α lying in the range −30° to +30°.

2. A cold plate for supporting electronic power components each fitted with a soleplate suitable for being put directly into contact with a cooling fluid, the soleplates of the electronic power components being fastened on the cold plate in a manner that is leaktight relative to the cooling fluid, said cold plate comprising:
   at least one recess (36, 38, 48, 50) including an opening that opens out under the soleplate of the electronic power component (6 to 10);
   at least one admission orifice (70) for admitting cooling fluid into the inside of the recess; and
   at least one discharge orifice (72) for discharging cooling fluid from the recess;
   wherein said cold plate further comprises:
   a spray plate (42; 112) interposed between the admission orifice (70) and the discharge orifice (72); and
   a plurality of rectilinear nozzles (86 to 90; 114 to 118) passing right through said plate in a spray direction, the length of the nozzle along the spray direction being longer than or equal to the greatest width of the nozzle perpendicular to said direction so as to form a jet (100 to 104) of cooling fluid along the spray direction, the spray direction of each nozzle being at an angle α relative to a direction perpendicular to the soleplate, the angle α lying in the range −30° to +30°.

3. The cold plate according to claim 2, wherein each nozzle (86 to 90; 114 to 118) is formed by a hole passing through the spray plate (42).

4. The cold plate according to claim 2, wherein the spray plate is plane, and wherein the spray direction of each nozzle is perpendicular to the front or rear face (80, 82) of the spray plate, the front face of the spray plate being the face facing towards the soleplate, and the rear face being the face opposite from the front face, and wherein the spray plate (42) is inclined at an angle β relative to the plane of the soleplate of the electronic power component, the angle β lying in the range −30° to +30°.

5. The cold plate according to claim 2, wherein the cold plate includes ducts (56 to 64) suitable for enabling the cooling fluid to flow through the admission and discharge orifices (70, 72), said ducts all being disposed in a common plane parallel to the plane defined by the soleplate.

6. The cold plate according to claim 2, wherein said cold plate further comprises:
   first and second recesses (36, 38), the first and second recesses each having an opening opening out under the soleplate of a common first electronic power component (6); and
   at least one third recess (48, 50) having an opening opening out under the soleplate of a second electronic power component (7),
   wherein said first recess (36) has a discharge orifice (72), said second recess has an admission orifice, said third recess has admission and discharge orifices, and said discharge orifice of said first recess is in fluid flow connection with said admission orifice of said second recess (38), passing via said admission and discharge orifices of said third recess (48, 50).

7. The cold plate according to claim 2, wherein the cold plate includes at least ten nozzles (86 to 90; 114 to 118) arranged relative to one another so as to produce jets (100 to 104) of cooling fluid having impact points that are uniformly distributed over the soleplate, i.e. the distances between two adjacent impact points are all equal to one another within ±15%.

* * * * *